(12) United States Patent
Ohsaki

(10) Patent No.: US 6,833,906 B1
(45) Date of Patent: Dec. 21, 2004

(54) PROJECTION EXPOSURE APPARATUS, AND DEVICE MANUFACTURING METHOD USING THE SAME

(75) Inventor: Yoshinori Ohsaki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/577,978

(22) Filed: May 25, 2000

(30) Foreign Application Priority Data

May 28, 1999 (JP) ............................................ 11-149586

(51) Int. Cl.⁷ ........................ G03B 27/72; G03B 27/42; G03B 27/54; G01B 11/00
(52) U.S. Cl. ............................ 355/69; 355/53; 355/67; 356/400
(58) Field of Search ............................... 355/53, 55, 56, 355/67–71; 250/201, 548; 356/399–401

(56) References Cited

U.S. PATENT DOCUMENTS

| | | | |
|---|---|---|---|
| 4,701,606 A | * 10/1987 | Tanimoto et al. | ............ 250/201 |
| 5,331,369 A | * 7/1994 | Terasawa et al. | ............. 355/53 |
| 5,789,734 A | * 8/1998 | Torigoe et al. | ........... 250/201.1 |
| 5,805,273 A | 9/1998 | Unno | ......................... 355/30 |
| 5,828,455 A | 10/1998 | Smith et al. | ................. 356/354 |

FOREIGN PATENT DOCUMENTS

| | | |
|---|---|---|
| EP | 0 851 304 | 7/1998 |
| JP | 10-242048 | 9/1998 |
| JP | 410284368 A | * 10/1998 |

* cited by examiner

*Primary Examiner*—Henry Hung Nguyen
(74) *Attorney, Agent, or Firm*—Fitzpatrick, Cella, Harper & Scinto

(57) ABSTRACT

A projection exposure apparatus includes a projection optical system for projecting a transfer pattern of a first object onto a second object, a first illumination system for performing illumination under a first illumination condition, wherein the transfer pattern of the first object illuminated under the first illumination condition is projected onto the second object through the projection optical system, a second illumination system for performing illumination under a second illumination condition, a light intensity detector, and an information processing system operable, as a particular pattern being illuminated by the second illumination system under the second illumination condition is imaged by the projection optical system, to measure a wavefront aberration of the projection optical system on the basis of detection of a light intensity distribution of an image of the particular pattern made through the light intensity detector.

56 Claims, 12 Drawing Sheets

PROJECTION EXPOSURE APPARATUS, AND DEVICE MANUFACTURING METHOD USING THE SAME

FIELD OF THE INVENTION AND RELATED ART

This invention relates to a projection exposure apparatus and a device manufacturing method using the same. For example, the invention is suitably applicable to a projection exposure apparatus or a scan type exposure apparatus to be used in a lithographic process, among device manufacturing processes for production of semiconductor devices such as IC or LSI, image pickup devices such as CCD, display devices such as a liquid crystal panel, or magnetic heads, for example, particularly in relation to projection of a pattern of a first object such as a reticle onto a second object such as a wafer through a projection optical system.

As regards a microprocessing technology for semiconductor devices such as IC or LSI, many proposals have been made on a reduction projection exposure apparatus (stepper) or a scan type projection exposure apparatus, for forming an image of a circuit pattern of a mask or reticle upon a photosensitive substrate through a projection optical system (projection lens) and for exposing the photosensitive substrate in accordance with a step-and-repeat method or a step-and-scan method.

In these exposure apparatuses, a pattern of a reticle must be transferred onto a wafer accurately in accordance with a predetermined magnification (reduction ratio). To this end, it is important to use a projection lens (projection optical system) having a good performance and small aberrations. Particularly, in order to meet recent requirements of further miniaturization of a semiconductor device, in many cases a pattern which is beyond the normal imaging performance of a projection optical system has to be transferred to a wafer. Thus, the aberration of a projection optical system becomes very influential to the pattern to be transferred. On the other hand, for the projection lens, enlargement of an exposure area as well as enlargement of its numerical aperture (NA) are desired, which are not convenient for aberration correction.

In these circumstances, it is desired to perform measurement of the imaging performance of a projection lens, particularly, wavefront aberration thereof, in a state that the projection lens is being mounted on an exposure apparatus, that is, a state that it is used for a practical exposure process.

An example of measurement methods for wavefront aberration of a projection lens is a phase restoration method. This method has been used in the field of electron microscopes or astronomical telescopes having large aberrations, for improvement of the resolution. In accordance with this phase restoration method, a phase distribution of an image is detected on the basis of image intensity distributions at plural positions such as image plane, pupil plane, and defocus position, for example. From the detected phase distribution, a wavefront aberration of an optical system is calculated.

In this phase restoration method, an actually measured intensity distribution of an image on an image plane is used and, after an arbitrary phase is applied, Fourier transform is made thereto to detect a complex amplitude distribution upon a pupil plane. Subsequently, while keeping a phase component of the thus detected complex amplitude distribution, only an absolute value corresponding to an intensity component thereof is replaced by a value (root square of the intensity at the pupil plane) corresponding to the actually measured value. The result is then taken as a fresh complex amplitude distribution, and inverse Fourier transform is made thereto, to determine a complex amplitude distribution upon an image plane. Again, while keeping its phase component, the intensity is replaced by an actually measured value.

By repeating the above-described calculations, complex amplitude distributions on the image plane and the pupil plane are calculated and, from the phase distribution of the complex amplitude distribution at the pupil plane, the wavefront aberration of the projection lens is detected. The phase restoration method will be described later in more detail, in conjunction with preferred embodiments of the present invention.

Where a wavefront aberration of a projection lens is to be calculated in accordance with the phase restoration method, idealistically it is necessary to measure an intensity distribution of an image under a condition of coherent illumination ($\sigma=0$). If the value $\sigma$ (that is, a ratio of the numerical aperture of an illumination-system to the numerical aperture of the projection lens) becomes larger, the calculated wavefront aberration contains a larger error. For example, if the wavefront aberration should be calculated with a precision of about $0.01\lambda$, a relation $\sigma \leq 0.1$ is required. Even though the precision is lowered to about $0.03\lambda$, a relation $\sigma \leq 0.2$ has to be satisfied. On the other hand, when a pattern of a reticle is to be photo printed on a wafer, usually the reticle is illuminated under a partially coherent illumination condition. Thus, normally, an illumination system of an exposure apparatus has $\sigma$ which is in a range of about $0.2<\sigma<0.9$. No illumination system as providing $\sigma \leq 0.2$ is loaded. Further, many illumination systems for an exposure apparatus are equipped with an incoherency-transforming mechanism.

For these reasons, when a wavefront aberration of a projection lens is to be detected in accordance with the phase restoration method while using an illumination optical system for a practical exposure process as it is, there is a problem with respect to the precision.

SUMMARY OF THE INVENTION

It is an object of the present invention to provide a projection exposure apparatus and/or a device manufacturing method using the same, by which a wavefront aberration of a projection optical system (projection lens) for projecting a pattern of a mask onto a wafer can be measured very precisely and by which production of a large integration device can be facilitated.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
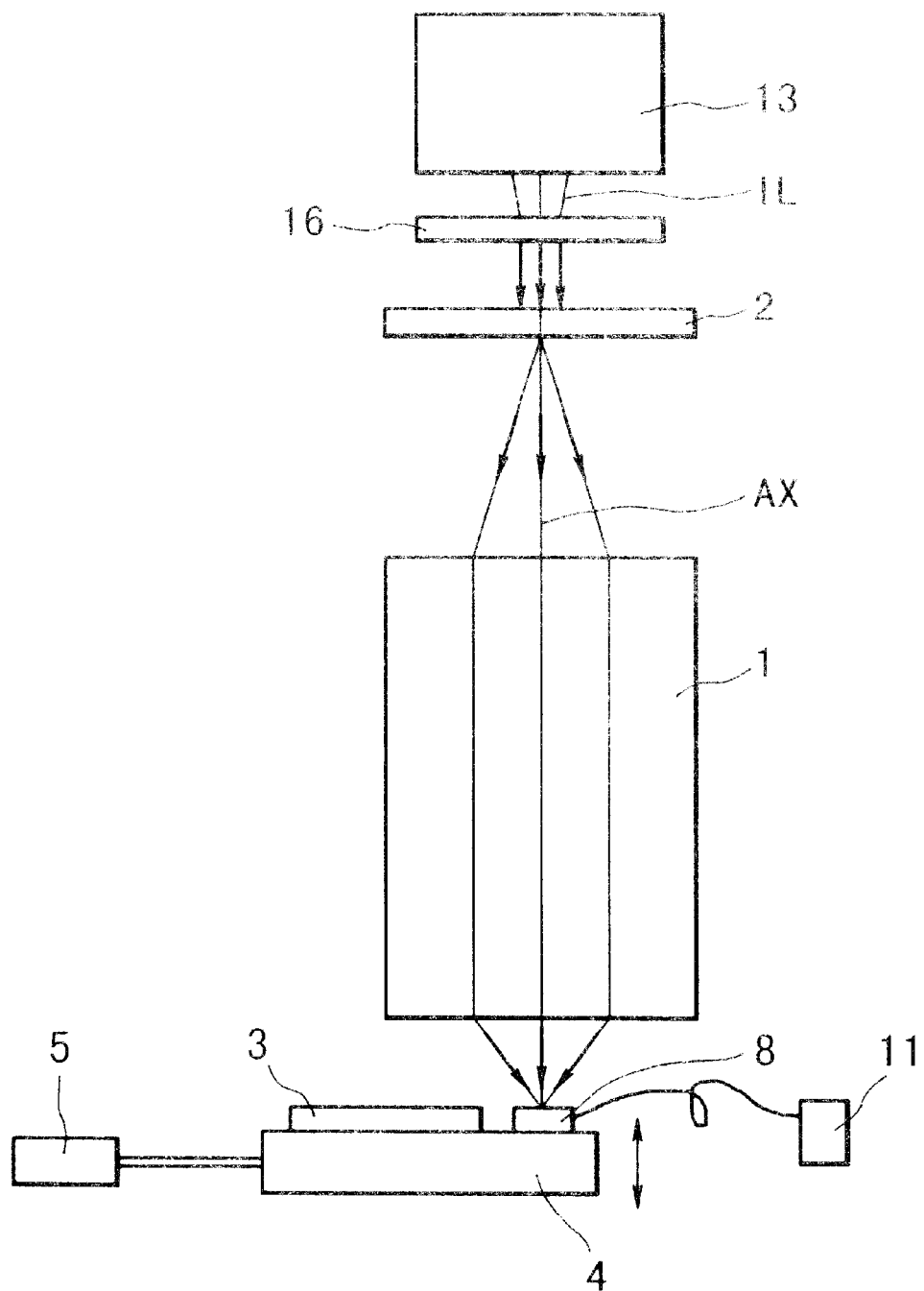
FIG. 1 is a schematic view of a main portion of a projection exposure apparatus according to a first embodiment of the present invention.

FIG. 1 is a schematic view of a main portion of a projection exposure apparatus according to a first embodiment of the present invention, wherein a pattern (transfer pattern) of a reticle (first object) 2 is to be projected through a projection lens 1 onto a wafer (second object) 3. As compared with a conventional exposure apparatus having a wavefront calculating mechanism based on a phase restoration method, in the apparatus of this embodiment there is a demountably mountable coherency-transforming optical system 16 being added to an exposure illumination system 13.

In the phase restoration method for detecting a wavefront aberration of the projection lens 1 in this embodiment, first, an illumination light beam IL of exposure wavelength (printing wavelength) from an exposure illumination system (illumination optical system) 13 and passing through the incoherency-transforming optical system 16 illuminates a pattern (particular pattern) on the reticle 2 or on any other object. Then, an image of the particular pattern is formed (imaged) by the projection lens 1 upon a light intensity detecting means 8 which is mounted on a wafer stage 4. By using this intensity detecting means 8, an intensity distribution of the particular pattern image is measured. Subsequently, the wafer stage 4 is moved in an optical axis direction AX through a stage driving mechanism 5, such that, upon the light intensity detecting means 8 surface, the particular pattern image is defocused. The intensity distribution of the particular pattern image at that moment is measured. By using the results concerning the intensity distributions of these two pattern images, an information processing unit (wavefront aberration measuring means) 11 performs repeated calculations such as Fourier transform and inverse Fourier transform, for example, whereby the wavefront aberration of the projection lens 1 is calculated. It is to be noted here that the example shown in FIG. 1 concerns measurement of a wavefront aberration on the optical axis of the projection optical system 1.

Figure 2:
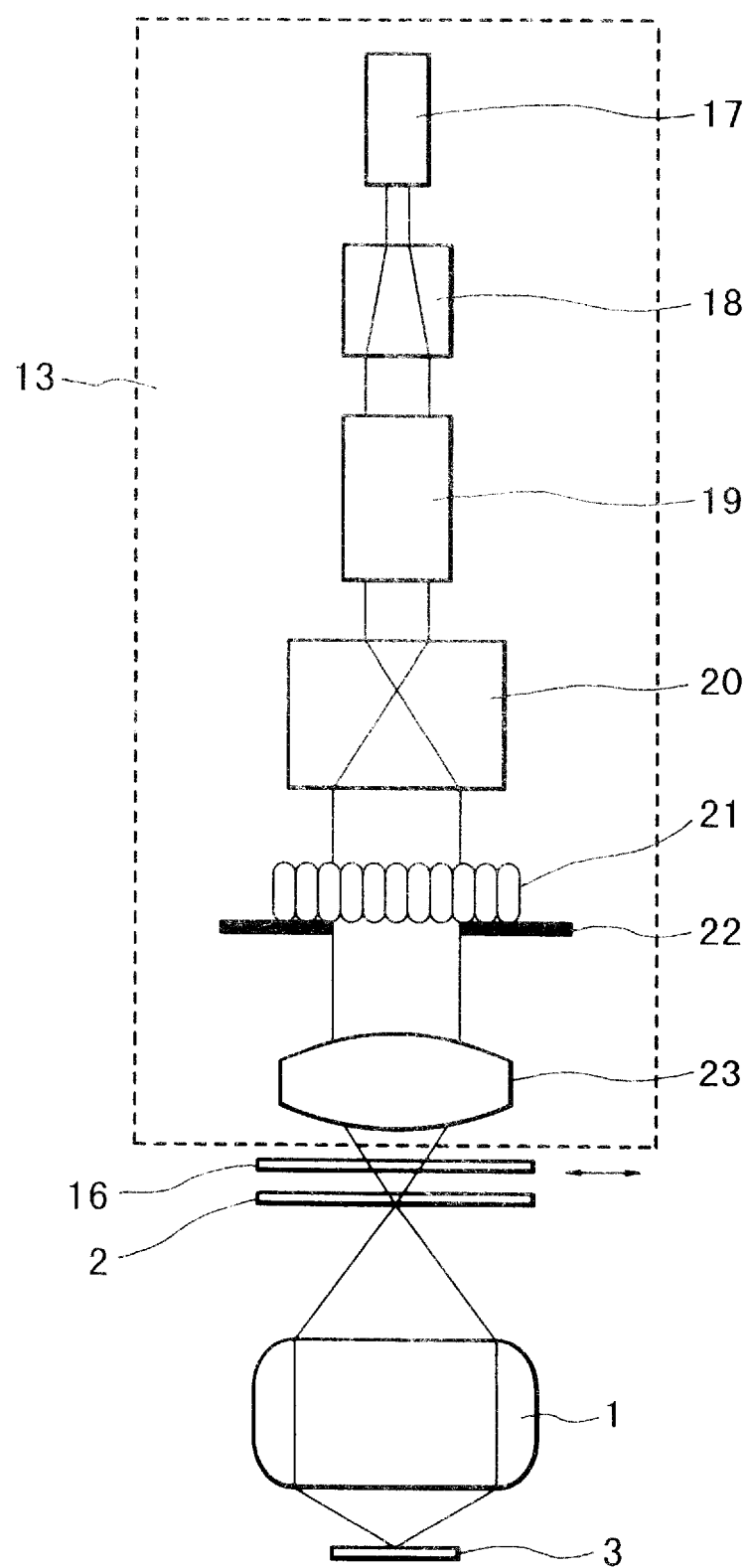
FIG. 2 is a schematic view of an exposure illumination system in the apparatus of FIG. 1.

FIG. 2 is a schematic view for explaining details of the exposure illumination system 13. In FIG. 2, a light beam emitted from a light source 17 such as a super high pressure Hg lamp or an excimer laser, for example, is transformed into illumination light of a desired shape, by means of a light shaping unit 18 including a beam expander or a cylindrical lens, for example. The light is then projected on an incoherency-transforming unit 19.

The incoherency-transformed light from the unit 19 is then received by an illumination state adjusting unit 20 including a zoom lens, by which the illumination σ value is adjusted. Subsequently, the light passes a lens array (fly's eye lens optical system) 21 having its lenses arrayed two-dimensionally, and then through an exit side stop 22, whereby the effective light source is determined. After this, the light is directed to a lens system 23. Thus, with the light from the lens system 23, the reticle 2 surface can be illuminated at a desired σ value determined through the incoherency-transforming optical system 16.

In this embodiment, since an excimer laser is used as the light source 17, the incoherency-transforming unit 19 is provided between the light shaping unit 18 and the illumination state adjusting unit 20. If an Hg lamp, for example, for emitting incoherent light is used as the light source, use of the incoherency-transforming unit 19 is unnecessary.

When a wavefront aberration of a projection lens 1 is to be calculated in accordance with the phase restoration method, idealistically it is necessary that the pattern of the reticle 2 is illuminated with coherent illumination (σ=0). If 0<σ, there occurs an error in the calculation, and the error becomes larger with a larger σ.

On the other hand, usually a projection lens 1 of an exposure apparatus has a wavefront aberration of 0.1λ (λ is the wavelength). For evaluation of such wavefront aberration, the wavefront aberration should be calculated at least at an order not greater than 0.01λ. In order that the wavefront aberration is calculated by using the phase restoration method and with a precision not higher than 0.01λ, the pattern of the reticle has to be illuminated with light of σ≦0.1. Further, also for qualitative evaluation of a relative change in wavefront aberration, for example, due to a change in environment caused by execution of an exposure process, a precision of an order of about 0.3λ is necessary. In that occasion, the reticle pattern should be illuminated with light of σ≦0.2.

The exposure illumination system (first illumination system) 13 is generally arranged to perform illumination of the reticle 2 in a partially coherent state or an incoherent state (first illumination condition), for practical exposure process for printing a circuit pattern on the wafer 3. Thus, when the phase restoration method is executed only by use of the exposure illumination system 13, coherent illumination is not attainable and, therefore, the measurement has to be done while making σ of the exposure illumination system 13 smallest. However, even a smallest value σ as actually loaded in a semiconductor device manufacturing exposure apparatus is about 0.3. It is therefore very difficult to calculate the wavefront aberration by the phase restoration method, with a satisfactory precision.

In this embodiment, in consideration of the above, the coherency-transforming optical system 16 is inserted between the reticle 2 and the exposure illumination system 13, for measurement of the wavefront aberration, by which the illumination light being convergent spherical wavefronts, is transformed into light of parallel wavefronts. By this, the pattern of the reticle 2 can be illuminated through coherent illumination or approximately coherent illumination (second illumination condition). As a result, high-precision wavefront aberration calculation based on the phase restoration method can be accomplished.

While in this embodiment the coherency-transforming optical system 16 is added to the illumination optical system 13, the coherency-transform may be attained by removing a lens (e.g., the incoherency-transforming unit 19) of the illumination optical system 13 or by adding another optical system after the removal, for example.

In this embodiment as described hereinbefore, the illumination condition for the reticle is changed between an exposure process for printing a pattern of the reticle 2 on a wafer 3 and a process for calculating the wavefront aberration of the projection lens 1 based on the phase restoration method. More specifically, for the exposure process, the reticle 2 is illuminated with partially coherent light or incoherent light (first illumination condition). For the wavefront aberration calculation based on the phase restoration method, a pattern of the reticle is illuminated with coherent light or approximately coherent light ($\sigma \leq 0.2$, preferably, $\sigma \leq 0.1$) (second illumination condition), followed by measuring light intensity distributions upon a pupil plane and a defocus plane, and detecting the wavefront aberration of the projection lens 1.

Further, for the exposure process, the coherency-transforming optical system 16 is moved out of the light path, such that the reticle is illuminated in the partially coherent state (first illumination condition) while using the exposure illumination system 13 as it is. Then, for measurement of the wavefront aberration based on the phase restoration method, a partial optical system is demounted from the exposure illumination system or, alternatively, the coherency-transforming optical system 16 is added thereto (of course, both may be done). By doing so, the wavefront aberration of the projection optical system can be calculated very precisely.

As an alternative, the light source may be changed so as to define best spatial coherency or best light quantity suitable for the exposure process and the phase restoration process, respectively, thereby to enable high precision calculation of the wavefront aberration of the projection optical system. As a further alternative, separate illumination optical systems (first and second optical systems) may be used for the exposure process and the phase restoration process, respectively, such that the reticle is illuminated in a partially coherent illumination state for the exposure process, while it is illuminated in a coherent or approximately coherent state for execution of measurement of the wavefront aberration of the projection lens based on the phase restoration method. This enable high precision calculation of the wavefront aberration of the projection optical system.

The second optical system may be an alignment optical system for performing alignment between a reticle and a wafer by use of light of exposure wavelength, or it may be a portion of such alignment optical system. If the illumination condition thereof is set to $0 \leq \lambda \leq 0.2$, the wavefront aberration can be calculated very precisely in accordance with the phase restoration method, without addition of any optical system in the exposure apparatus, or with minimum addition of an optical system. Alternatively, the illumination condition of the alignment system may be changed between the alignment measurement process and the wavefront aberration measurement process based on the phase restoration method, to assure best measurement states, respectively.

Figure 3:
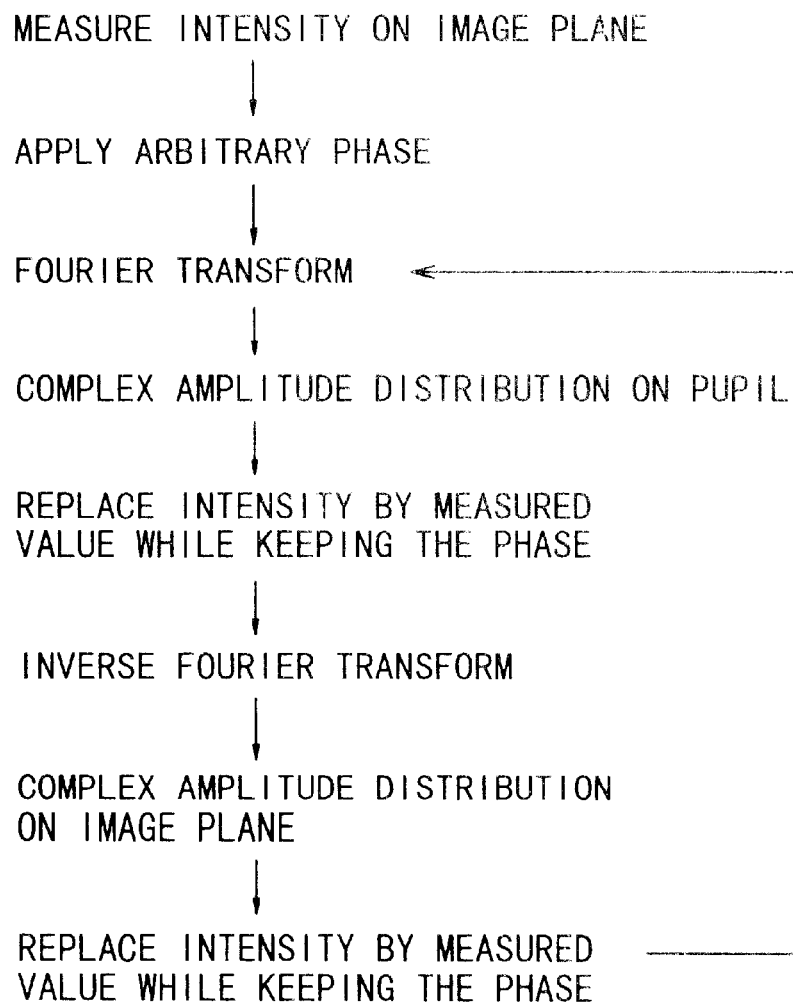
FIG. 3 illustrates a first algorithm of a phase restoration method, according to the present invention.
Figure 4:
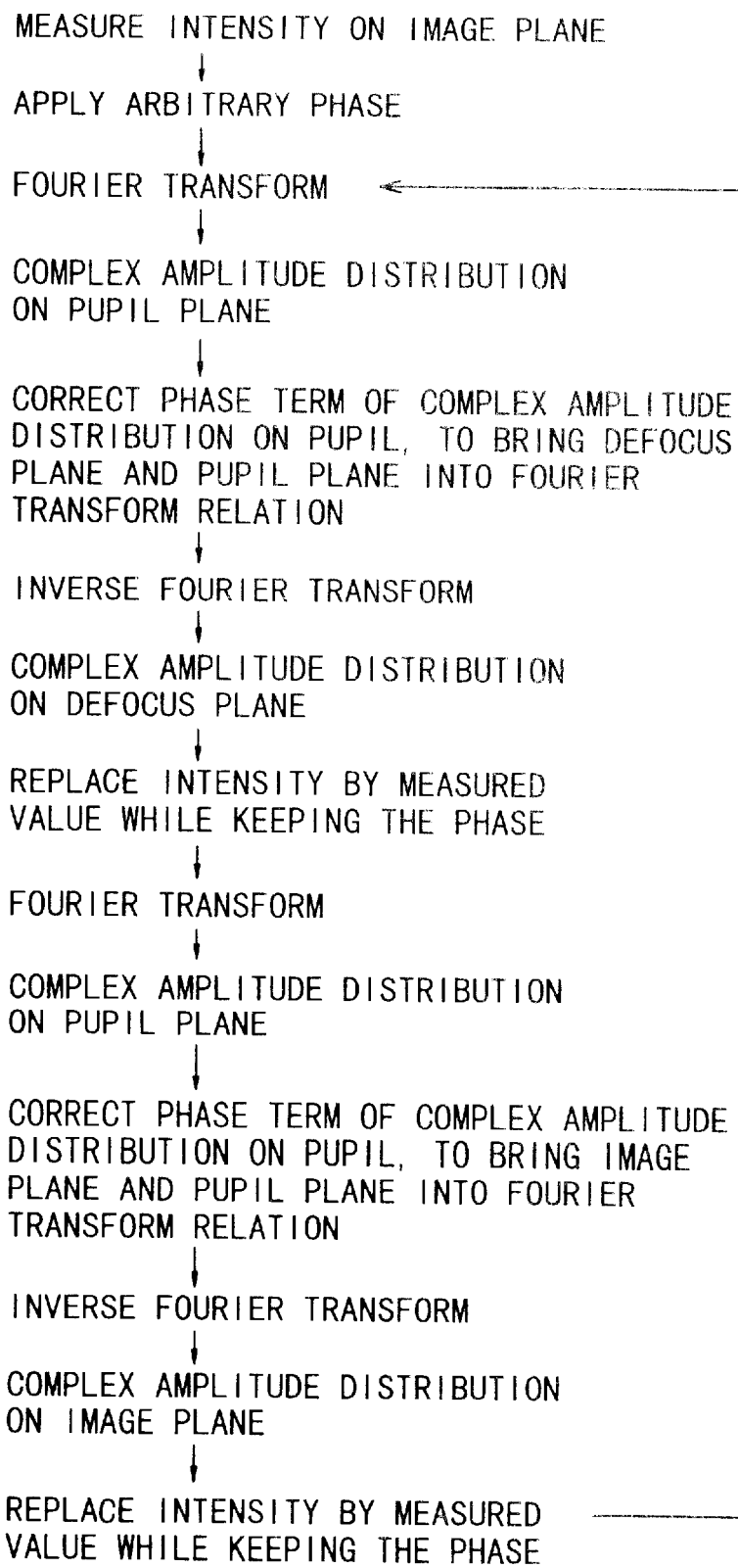
FIG. 4 illustrates a second algorithm of a phase restoration method, according to the present invention.

FIGS. 3 and 4 illustrate algorithms based on the phase restoration method, for measurement of a wavefront aberration of a projection lens, both usable in this embodiment.

The phase restoration method has been used in the field of electron microscopes or astronomical telescopes having large aberrations, for improvement of the resolution. In accordance with this phase restoration method, a phase distribution of an image is detected on the basis of image intensity distributions at plural positions such as image plane, pupil plane, and defocus position, for example. From the detected phase distribution, a wavefront aberration of an optical system (projection lens) is calculated.

The algorithm of phase restoration method shown in FIG. 3 will be explained first. Initially, a measured intensity distribution of an image on an image plane is used and, after an arbitrary phase is applied thereto, Fourier transform is made thereto to detect a complex amplitude distribution upon a pupil plane. Subsequently, while keeping a phase component of the thus detected complex amplitude distribution, only an absolute value corresponding to an intensity component thereof is replaced by a value (root square of the intensity at the pupil plane) corresponding to the actually measured value. The result is then taken as a fresh complex amplitude distribution, and inverse Fourier transform is made thereto, to determine a complex amplitude distribution upon an image plane. Again, while keeping its phase component, the intensity is replaced by an actually measured value. By repeating the above-described calculations, complex amplitude distributions on the image plane and the pupil plane are calculated and, from the phase distribution of the complex amplitude distribution at the pupil plane, the wavefront aberration of the lens is detected.

FIG. 4 illustrates an algorithm of phase restoration method in a case where measurement of an intensity distribution upon a pupil plane is difficult to accomplish, as in a photolithographic process. In the algorithm of FIG. 4, between an image plane and a defocus plane across a pupil plane, transform and inverse transform are repeated, by which a complex amplitude distribution at the image plane and a complex amplitude distribution at the defocus plane are calculated. From the results, the phase distribution at the pupil, that is, the wavefront aberration of the projection lens is detected.

Figure 5:
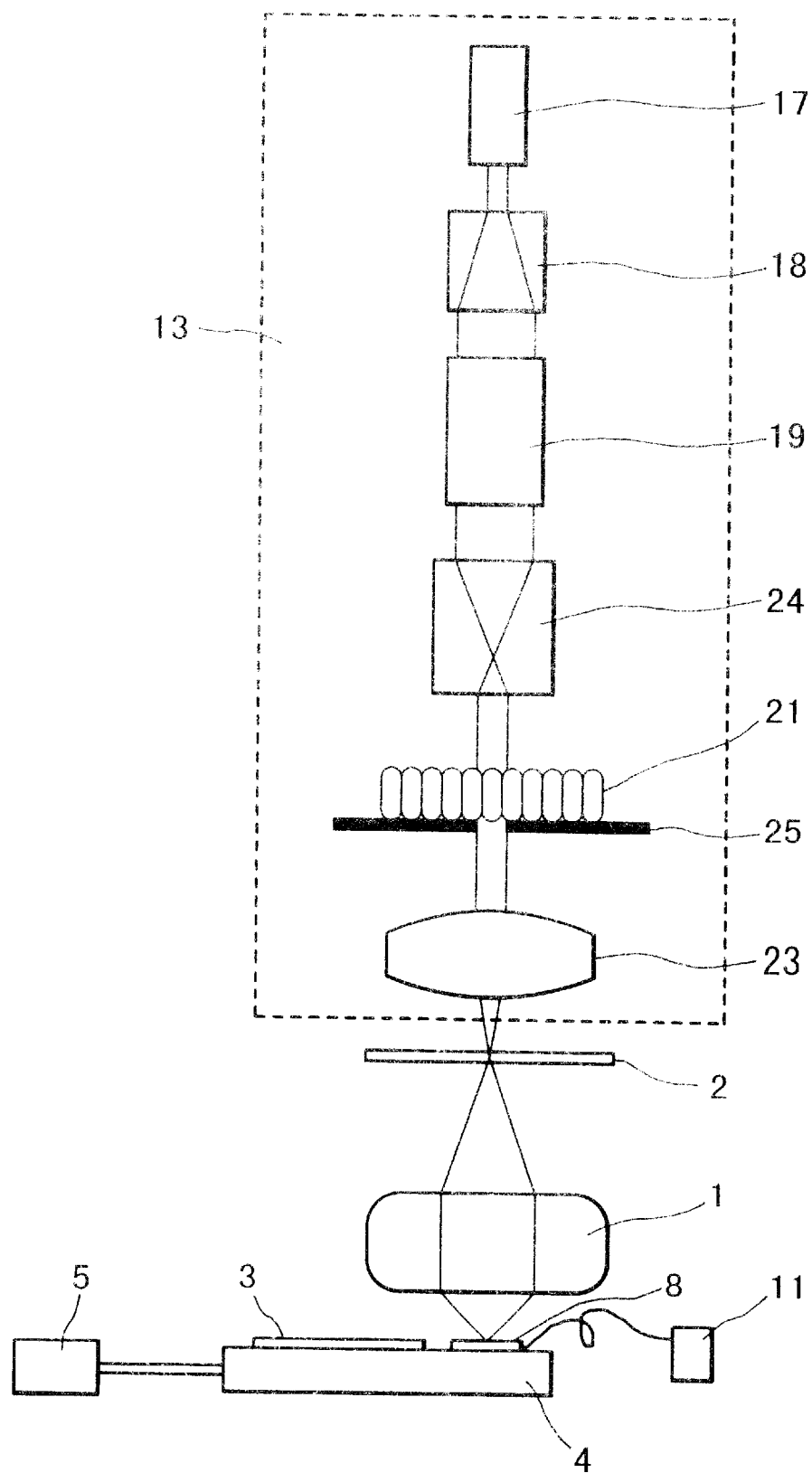
FIG. 5 is a schematic view of a main portion of a projection exposure apparatus according to a second embodiment of the present invention.

FIG. 5 is a schematic view of a main portion of a projection exposure apparatus according to a second embodiment of the present invention. In FIG. 5, elements corresponding to those shown in FIG. 2 are denoted by like numerals.

In this embodiment, the illumination state adjusting unit 20 and the stop 22 of the exposure illumination system 13 as shown in FIG. 2 are replaced by an illumination state adjusting unit 24 and a stop 25, between execution of an exposure process and execution of the phase restoration method. As shown in FIG. 2, what determines the illumination condition for the exposure process is the combination of the illumination state adjusting unit 20 and the stop 22 inside the exposure illumination system 13. The illumination state adjusting unit 20 mainly comprises a zoom optical system which serves to change the size of an effective light source in accordance with the illumination condition for the exposure process.

Generally, the value a in regard to the illumination condition for wafer exposure to print a pattern on the wafer is in a range of about 0.3 to 0.8. Thus, the zoom optical system may be one covering such range. In the phase restoration method, on the other hand, a reticle must be illuminated in an approximately coherent state wherein $\sigma$ is not greater than 0.2, preferably not greater than 0.1. For most convenient illumination with $\sigma$ of 0.2 or less, the aperture 22 shown in FIG. 2 may be narrowed to satisfy $\sigma \leq 0.2$. In that occasion, since at the illumination state adjusting unit 20 the light has an expansion as of about $\sigma=0.3$, an eclipse may occur at the stop 22 portion and, as a result, the light quantity may decrease. Particularly, the light quantity may reduce if σ is not greater than 0.1. Thus, with the phase restoration method wherein the light intensity is to be measured, it may adversely influence the wavefront aberration calculation precision. While a zoom optical system that can cover a range of σ from 0.1 to 0.2 may be used, enlargement of the zoom ration causes an increase in size and weight of the illumination state adjusting unit 20. Further it becomes difficult to suppress non-uniformness of illuminance for all zoom lenses.

In this embodiment, in consideration of the above, as shown in FIG. 5, for execution of the projection lens on the basis of the phase restoration method, the illumination state adjusting unit inside the illumination optical system 13 is replaced by the illumination state adjusting unit 24 for the phase restoration method while, on the other hand, the stop is replaced by the stop 25 to change a to be not greater than 0.2. More specifically, for the exposure process, a zoom optical system with which σ can change from about 0.3 to about 0.8 is used in the illumination state adjusting unit 20. For execution of the phase restoration method, the illumination state adjusting unit 24 for phase restoration method which σ becomes not greater than 0.2 is used. In this manner, in both of the exposure process and phase restoration process, the reticle can be illuminated with best modes, respectively. As a result of this, the wavefront of the projection lens 1 can be measured very precisely.

Figure 6:
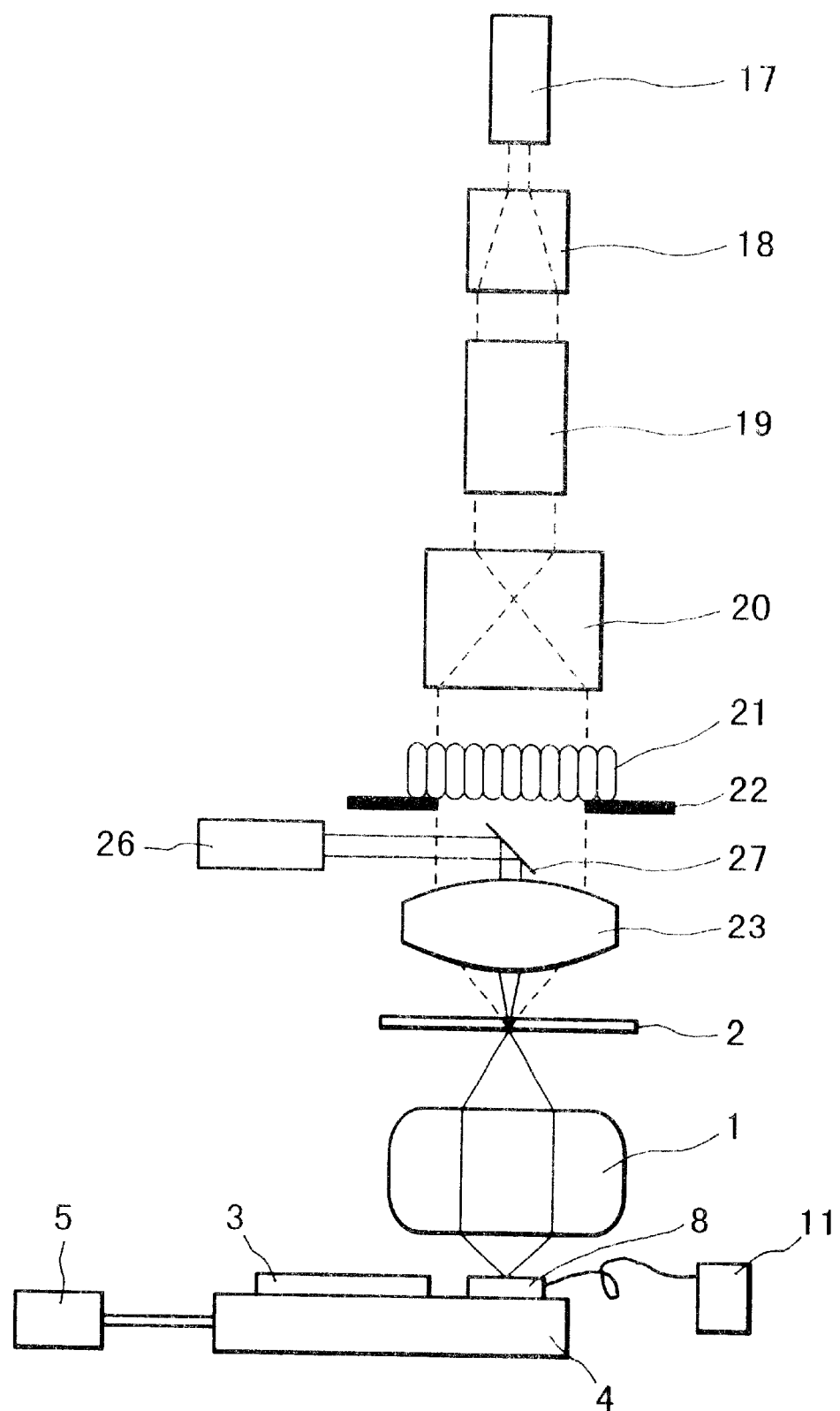
FIG. 6 is a schematic view of a main portion of a projection exposure apparatus according to a third embodiment of the present invention.

FIG. 6 is a schematic view of a main portion of a projection exposure apparatus according to a third embodiment of the present invention. In FIG. 6, elements corresponding to those of FIG. 2 are denoted by like numerals.

In this embodiment, as shown in FIG. 6, for execution of wavefront aberration measurement based on the phase restoration method, a demountable mirror 27 being movable out of the light path is inserted between a stop 22 and a lens unit 23. A second light source 26 emits light of the same wavelength as the exposure wavelength, so that, through the mirror 27 and the lens 23, a pattern on a reticle 2 is illuminated in coherent state or approximately coherent state. This differs from the first embodiment of FIG. 2.

With the provision of the light source 26 for phase restoration, in addition to the exposure light source 17, the reticle 2 can be illuminated with a light quantity best suited for the phase restoration method. Thus, the wavefront aberration can be calculated very precisely. Further, while not shown in FIG. 6, a lens or the like may be disposed between the second light source 26 and the mirror 27 or between the mirror 27 and the lens unit 23, for coherent illumination of the reticle.

Figure 7:
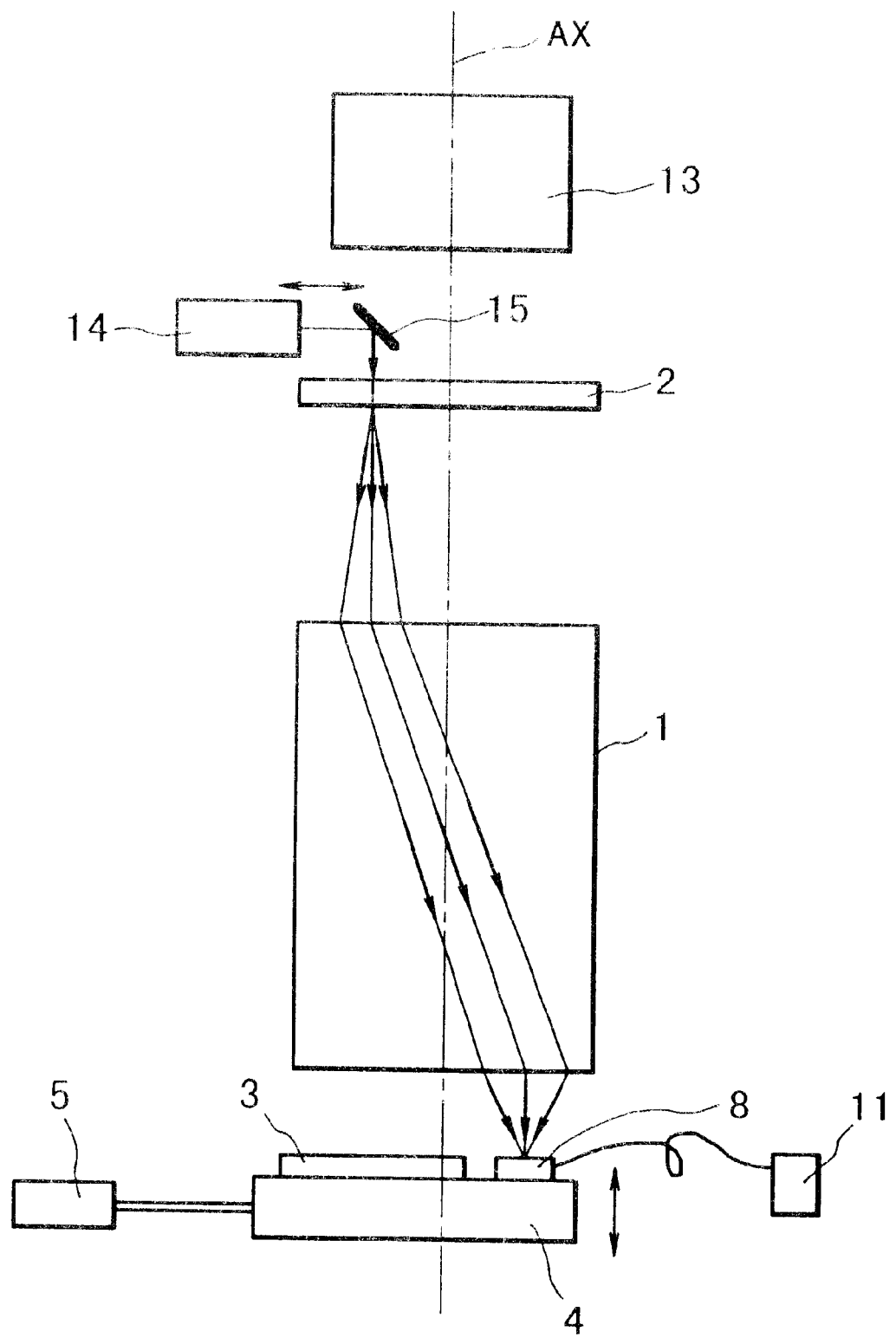
FIG. 7 is a schematic view of a main portion of a projection exposure apparatus according to a fourth embodiment of the present invention.

FIG. 7 is a schematic view of a main portion of a projection exposure apparatus according to a fourth embodiment of the present invention. In FIG. 7, elements corresponding to those of FIG. 1 are denoted by like numerals. FIG. 7 concerns a case wherein a wavefront aberration out of the optical axis of the projection optical system 1 is to be detected.

In this embodiment, as shown in FIG. 7, a second optical system 14 is provided, in addition to the exposure illumination system 13. For detection of a wavefront aberration of the projection lens 1 on the basis of phase restoration method, the second optical system 14 is used to illuminate a pattern on the reticle 2. Also, for an exposure process, the second optical system 14 as well as the mirror 15 move in a direction of an arrow in FIG. 7 so as not to interfere with the exposure light. Namely, they are demountable out of the light path. Further, the illumination condition of the second illumination optical system 14 satisfies coherent illumination (σ=0) or approximately coherent illumination (σ≦0.2). Thus, the wavefront aberration of the projection lens 1 can be measured, under an idealistic condition for the phase restoration method.

In this embodiment, it is not at all necessary to change or modify the exposure illumination system 13. Thus, an optimum illumination state for the phase restoration method is accomplished in a very simple way. The light source for the second illumination optical system 14 may comprise the same light source as the exposure light source, or it may comprise a separate light source having the same wavelength as of the exposure light source.

Figure 8:
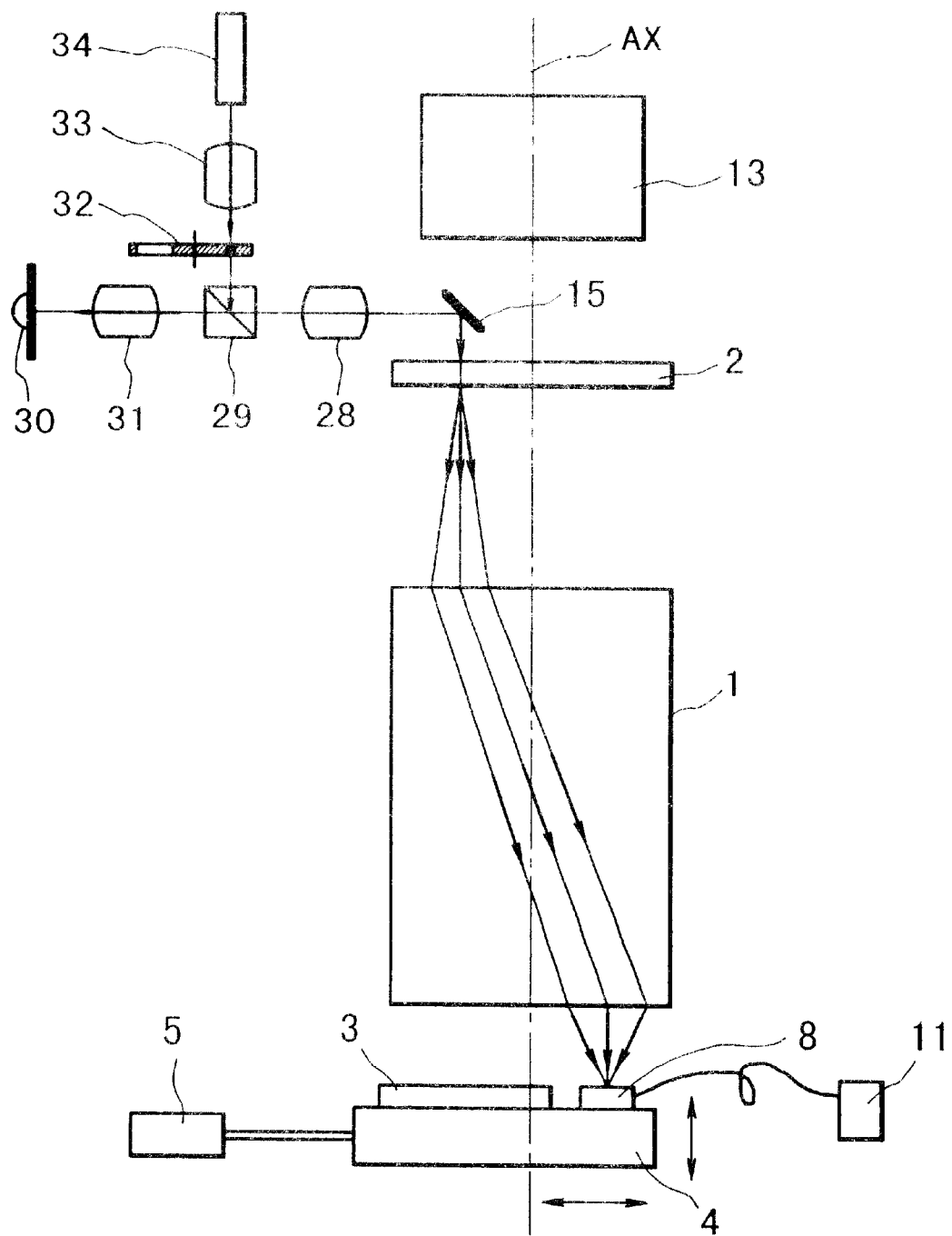
FIG. 8 is a schematic view of a main portion of a projection exposure apparatus according to a fifth or sixth embodiment of the present invention.

FIG. 8 is a schematic view of a main portion of a projection exposure apparatus according to a fifth embodiment of the present invention. In FIG. 8, elements corresponding to those of FIG. 1 are denoted by like numerals.

In this embodiment, calculation of wavefront aberration of the projection lens 1 based on the phase restoration method can be done while using an alignment optical system for performing registration (alignment) between a reticle 2 and a wafer 3. As shown in FIG. 8, the alignment optical system includes an objective lens 28, a beam splitter 29, a relay optical system 31, an illumination system relay optical system 33, a light source 34 and a sensor 30, for example. The light source 34 produces light of the same wavelength as of the exposure light, and it goes through the illumination system relay optical system 33 and the objective lens 28 to illuminate an alignment mark provided on a reticle 2. An image of the alignment mark is then formed on the sensor 30 through the objective lens 28 and the relay optical system 31. Further, through the illumination system relay optical system 33, the objective lens 28 and the projection lens 1, an alignment mark formed on the wafer 3 may be illuminated, and the mark may be imaged on the sensor 30, through the projection lens 1, the objective lens 28 and the relay optical system 33. This enables observation of the wafer alignment mark. Alternatively, a further optical system may be disposed between the relay optical system 31 and the sensor 30, for example, if desired.

The phase restoration method using the above-described alignment optical system will now be explained. For the alignment measurement process, the alignment mark is illuminated usually with a condition of 0.2≦σ≦1.0. To this end, in the alignment optical system shown in FIG. 8, an interchangeable stop 32 is disposed between the illumination system relay optical system 33 and the beam splitter 29, such that the σ value can be changed between the alignment process and for execution of wavefront aberration measurement based on the phase restoration method. More specifically, for execution of the wavefront aberration measurement based on phase restoration, the stop is changed to provide σ≦0.2, to illuminate a pattern on the reticle. The intensity distribution of an image thereof is then measured by using a light intensity measuring system 8, by which the wavefront aberration of the projection lens 1 can be calculated. Namely, as shown in FIG. 8, the interchangeable stop 32 is provided inside the alignment optical system, so that the stop is interchanged between alignment measurement and wavefront measurement based on phase restoration, thereby to assure best illumination states for them. With this structure, without use of any additional optical system, the phase restoration method can be executed very precisely, and the wavefront aberration of the projection lens 1 can be calculated conveniently and very precisely.

While in FIG. 8 the light source 34 of the alignment optical system is made separate from the exposure light source, the same light source as the exposure light source may be used. Further, the light intensity detecting system 8 in the preceding embodiments may comprise a photosensor such as a CCD which may be mounted on the stage 4. Alternatively, an enlargement optical system (not shown) may be used to enlarge the intensity distribution and, after that, it may be measured by use of the photosensor.

A sixth embodiment of the present invention will be described. The structure of this embodiment is similar to that of the fifth embodiment shown in FIG. 8.

This embodiment differs from the fifth embodiment in that, on the basis of the structure that the stage 4 can be moved two-dimensionally and precisely at a nanometer order, the light intensity detecting system 8 performs measurement of a light intensity distribution upon an image plane and adjacent thereto in accordance with a knife edge method. By using the knife edge method, the light intensity distribution can be measured very precisely without loading a heavy unit such as an enlargement optical system on the stage, as compared with a case where a photosensor is mounted directly on the stage 4. Alternatively, such an enlargement optical system and the knife edge method may be used in combination, to measure the light intensity distribution very precisely.

Figure 9:
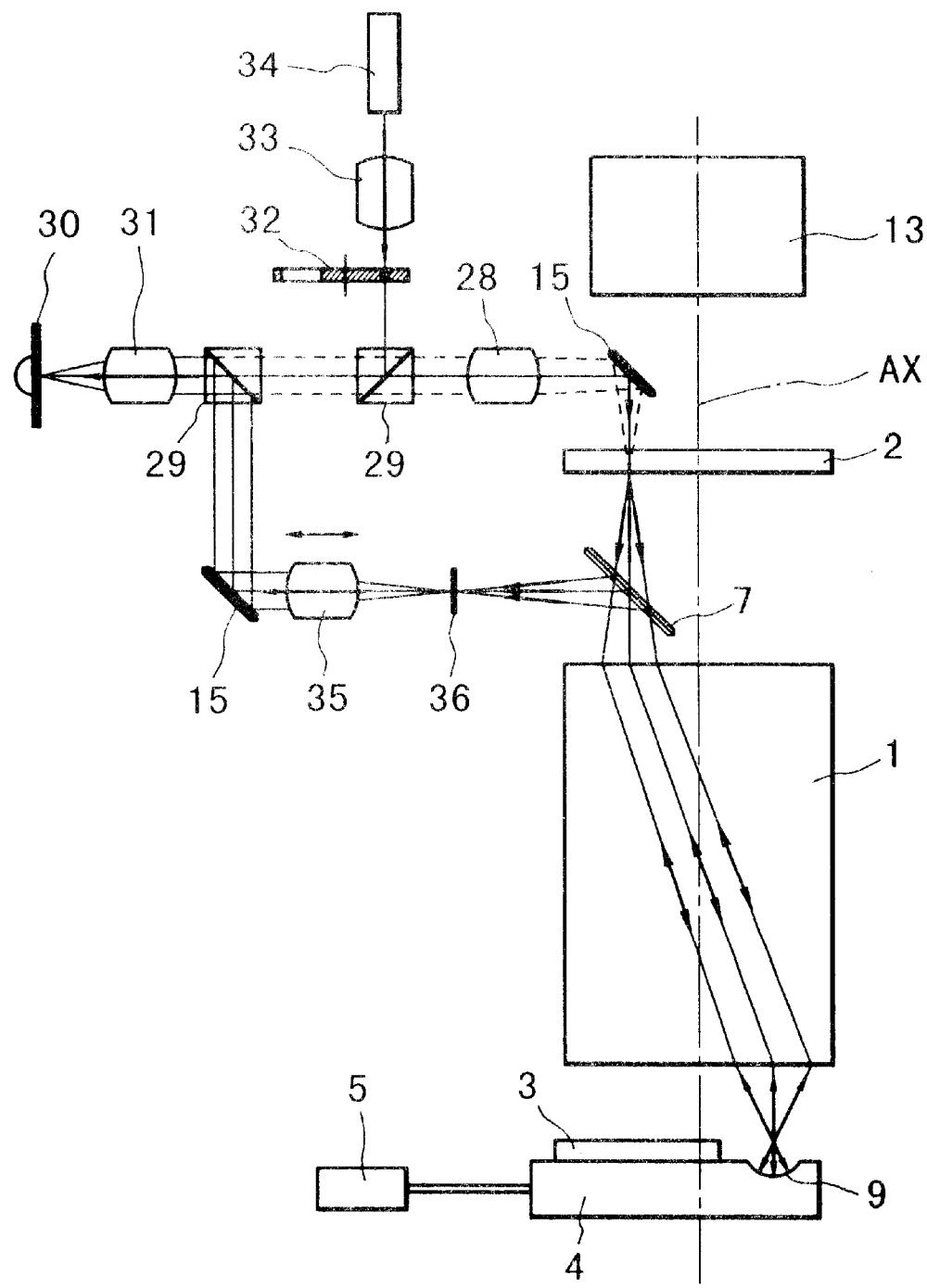
FIG. 9 is a schematic view of a main portion of a projection exposure apparatus according to a seventh embodiment of the present invention.

FIG. 9 is a schematic view of a main portion of a projection exposure apparatus according to a seventh embodiment of the present invention. In FIG. 9, elements corresponding to those of FIG. 8 are denoted by like numerals.

In this embodiment, as shown in FIG. 9, a reflecting portion (concave mirror portion) 9 is formed on a wafer stage 4. A pattern of a reticle 2 is imaged upon an intermediate image plane 36 by a projection lens 1. The intensity distribution of the image of the pattern is measured at the reticle 2 side, and the wavefront aberration of the projection lens 1 is measured in accordance with the phase restoration method. The measurement method will be described below, in greater detail.

A second light source 34 emits light of the same wavelength as the exposure wavelength. The light goes through an illumination system relay optical system 33, an interchangeable stop 32, a beam splitter 29a and an objective lens 28, and it illuminates a pattern on the reticle 2 under an approximately coherent condition ($\sigma$ is not greater than 0.2). While the pattern on the reticle 2 is imaged by the projection lens 1 at the same height as of the wafer 3, it is reflected by the mirror 9 formed on the wafer stage 4. Thus, the light goes again through the projection lens 1 and through a half mirror 7, it is imaged on the intermediate image plane 36. Here, the mirror 9 comprises a spherical surface mirror, and its curvature center is placed substantially at the same level as the wafer 3. The pattern of the reticle 2 being imaged on the intermediate image plane 36 after passing projection lens 1 twice, is then imaged on a sensor 30 while being magnified, through an enlargement optical system 35, a mirror 15, a beam splitter 29b, and a relay optical system 31. By moving the enlargement optical system 35 in a direction of an arrow in the drawing or by shifting the sensor 30, intensity distributions in an in-focus state and a defocus state can be measured.

With the structure described above, the measurement of the intensity distribution can be done with light passing the projection lens 1 twice. Thus, as compared with a method wherein light passes the projection lens only once, the measurement can be done with an aberration sensitivity twice higher than the latter. Further, since the intensity distribution is imaged on the sensor 30 while being enlarged by means of the enlargement optical system 35, it can be measured with a good precision and, therefore, the wavefront aberration can be measured very precisely. Furthermore, only a mirror has to be formed on the wafer stage 4 and, conveniently, there is no necessity of mounting a heavy unit such as a sensor thereon for measurement of the light intensity distribution. Since this embodiment is arranged like the fifth embodiment of FIG. 8 so that the phase restoration method is executed by using an alignment optical system, the sensor 30, relay optical system 31, light source 34, illumination system relay optical system 33 and the objective lens 28, for example, are used in common, in both optical systems. Therefore, the phase restoration method can be executed with minimum addition of optical elements.

While in this embodiment a spherical mirror is used as the mirror 9, a flat mirror having a reflection surface placed at the same level as the wafer surface may be used. In that occasion, among the wavefront aberration components, only symmetrical components such as spherical aberration and astigmatism, for example, can be measured at a twice sensitivity. This is because light beams passing through the projection lens in the forward path (from reticle side to wafer side) and in the backward path (from wafer side to reticle side) are revolutionally parallel to each other with respect to a principal light ray, such that asymmetrical components are cancelled. Further, while a mirror having a concave surface is shown in FIG. 9, it may comprise a convex surface mirror having a curvature center placed at substantially the same level as the wafer surface.

Figure 10:
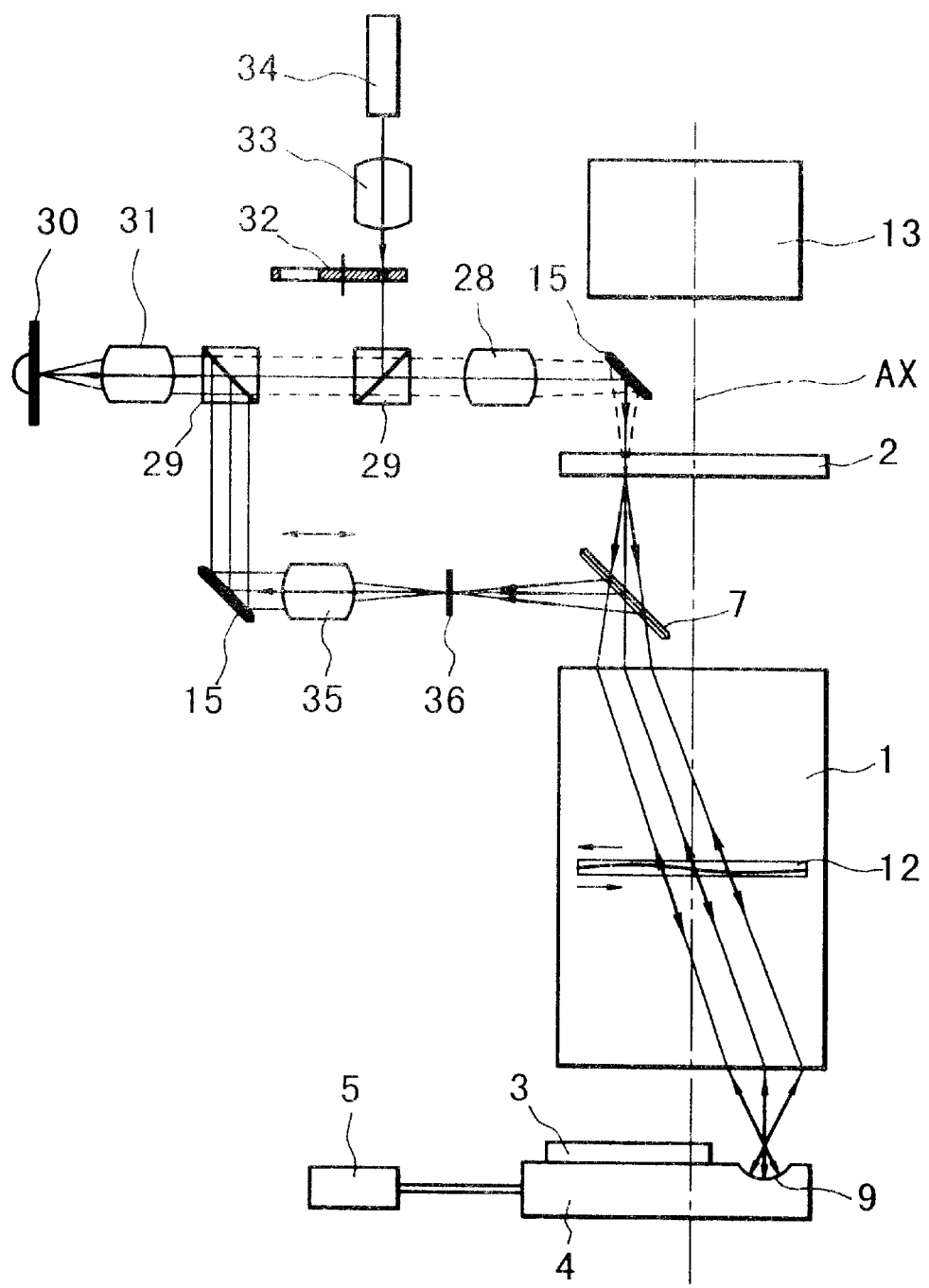
FIG. 10 is a schematic view of a main portion of a projection exposure apparatus according to an eighth embodiment of the present invention.

FIG. 10 is a schematic view of a main portion of a projection exposure apparatus according to an eighth embodiment of the present invention. In FIG. 10, elements corresponding to those of FIG. 9 are denoted by like numerals.

In this embodiment, on the basis of a wavefront aberration as calculated in accordance with the phase restoration method, an aberration correcting optical system 12 (FIG. 10) disposed inside a projection lens 1 is used to perform aberration correction, or the air spacing between lens elements of the projection lens 1 is adjusted. The aberration correcting optical system 12 may comprise an optical unit having a pair of aspherical surface optical elements of the same shape, being disposed so that their aspherical surfaces are opposed to each other, as disclosed in Japanese Laid-Open Patent Application, Laid-Open No. 242048/1998.

While in FIG. 10 the aberration correction optical system 12 is disposed adjacent to a pupil plane of the projection lens 1, it may be disposed between the projection lens 1 and the wafer 3 or between the projection lens 1 and the reticle 2. Alternatively, plural elements may be disposed there.

In the embodiments described above, the wavefront aberration of the projection lens 1 is calculated on the basis of a focus plane (image plane) and one defocus plane. However, it can be calculated from intensity distributions of images at two different defocus planes, without using the focus plane (image plane). Further, the wavefront aberration can be calculated by using intensity distributions of images at three or more positions including a focus plane (image plane) and plural defocus planes. Furthermore, while an example of aberration correcting optical system comprising a pair of aspherical surface optical elements has been described, the invention is not limited to it. The aberration correction may be accomplished by moving plural lenses in a projection lens system, or by disposing one or more parallel flat plates between the projection lens and the wafer or between the projection lens and the reticle and by changing the angles of these parallel flat plates.

A projection exposure apparatus according to any one of the preceding embodiments may be used so that, after detection of the relative position between a mask and a wafer, a pattern on the mask surface is transferred to the wafer surface. Thereafter, the wafer is processed by a development treatment, for production of devices.

Between such exposure process and execution of phase restoration method, the illumination condition can be changed, such that, within the major assembly of the exposure apparatus, a wavefront aberration of the projection lens can be calculated very precisely in accordance with the phase restoration method. Particularly, for execution of the phase restoration method, an optical system may be added to the exposure illumination system or only a portion of the exposure illumination system is used so as to assure that a reticle is illuminated in an approximately coherent condition. Alternatively, the illumination optical system may be changed by replacing a portion thereof, for example. In this manner, the wavefront aberration can be measured very precisely.

For execution of phase restoration method, as described above, a second optical system different from the exposure illumination system may be used to illuminate a reticle in an approximately coherent state. The wavefront aberration of the projection lens can be calculated very precisely, also in such case, in accordance with the phase restoration method and inside the major assembly of the exposure apparatus. The second optical system may comprise an alignment optical system. Thus, without any additional optical system, the wavefront aberration of the projection lens can be calculated very precisely in accordance with the phase restoration method and inside the major assembly of the exposure apparatus.

In accordance with the thus calculated wavefront aberration, an aberration correcting optical system, for example, disposed outside the projection lens, may be used to adjust the wavefront aberration of the projection lens. This enables an exposure process with small wavefront aberration.

While the foregoing embodiments have been described with reference to a step-and-repeat type projection exposure apparatus for manufacture of semiconductor devices, the invention is applicable also to a scanning exposure apparatus or an exposure apparatus for liquid crystal devices.

Next, an embodiment of a semiconductor device manufacturing method which uses a projection exposure apparatus according to any one of the preceding embodiments, will be explained.

Figure 11:
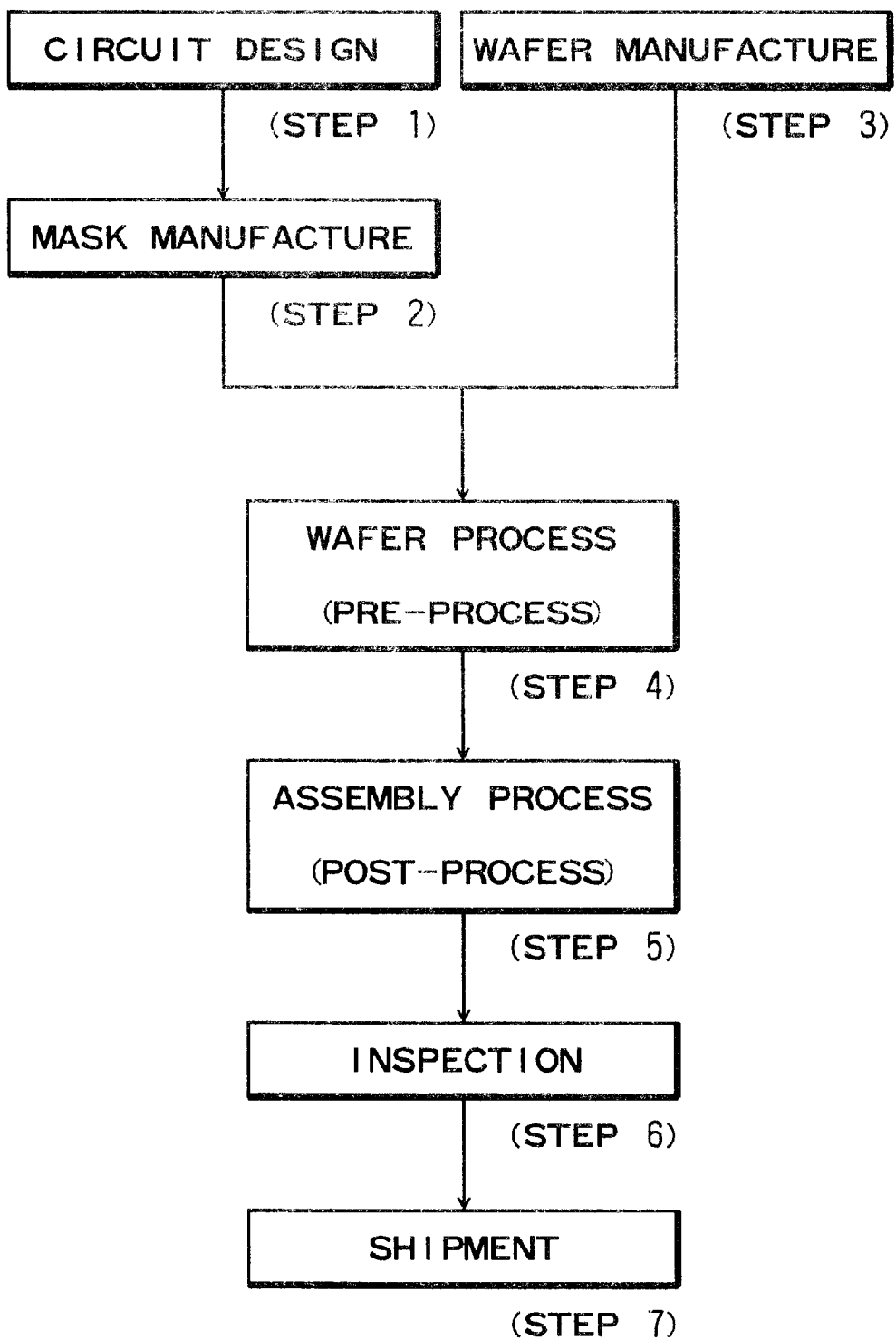
FIG. 11 is a flow chart of device manufacturing processes according to an embodiment of the present invention.

FIG. 11 is a flow chart of procedure for manufacture of microdevices such as semiconductor chips (e.g. ICs or LSIs), liquid crystal panels, CCDs, thin magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein operation check, durability check and so on for the semiconductor devices provided by step 5, are carried out. With these processes, semiconductor devices are completed and they are shipped (step 7).

Figure 12:
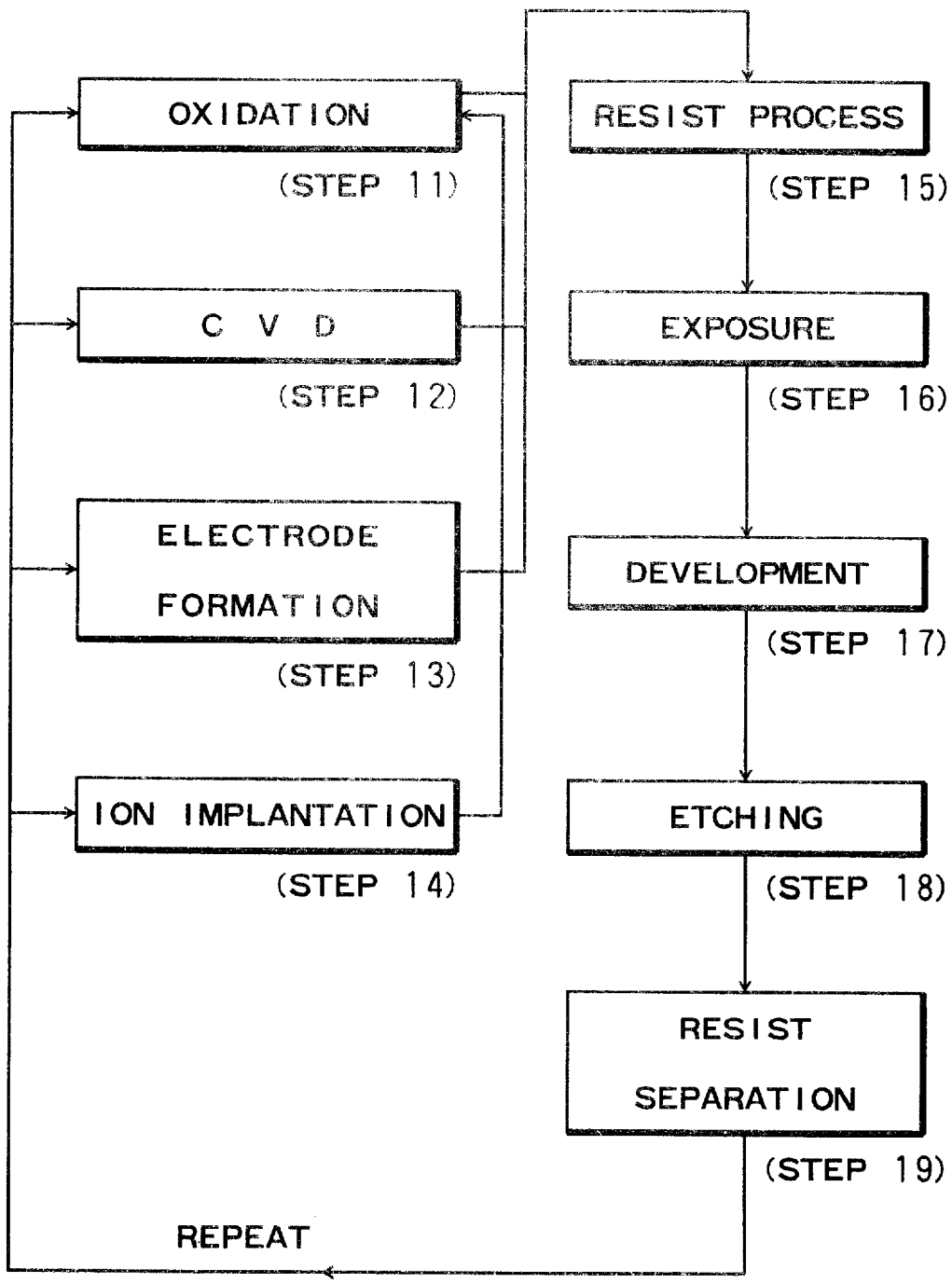
FIG. 12 is a flow chart for explaining details of a wafer process, in the procedure of the flow chart of FIG. 11.

FIG. 12 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the embodiments described hereinbefore, a wavefront aberration of a projection optical system (projection lens) for projecting a mask pattern onto a wafer can be measured very precisely. Thus, with the present invention, a projection exposure apparatus or a device manufacturing method which facilitates production of large integration devices is accomplished.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:
   a projection optical system for projecting a pattern of a first object onto a second object;
   a first illumination system for illuminating a transfer pattern of the first object under a first illumination condition, wherein the transfer pattern of the first object illuminated under the first illumination condition is projected onto the second object through said projection optical system;
   a second illumination system for performing illumination under a second illumination condition;
   a light intensity detector, wherein an image of a pattern of the first object, as the same is illuminated under the second illumination by said second illumination system, is formed through said projection optical system, and wherein said light intensity detector detects a light intensity distribution of the image of the pattern; and
   an information processing system for measuring a wavefront aberration of said projection optical system on the basis of the detection by said light intensity detector,
   wherein the first illumination condition is illumination of spatially partial coherency or incoherency, and the second illumination condition is illumination of spatially coherency or approximate coherency.

2. An apparatus according to claim 1, wherein said information processing system is arranged to detect a phase distribution of the image of the pattern on the basis of light intensity distributions defined in relation to images at different positions along an optical axis direction of said projection optical system, and to measure the wavefront aberration of said projection optical system on the basis of the detected phase distribution.

3. An apparatus according to claim 1, wherein the second object is a photosensitive substrate, and wherein said projection optical system is used to project and print the transfer pattern, being illuminated under the first illumination condition, onto an exposure region on the photosensitive substrate.

4. An apparatus according to claim 1, wherein said information processing system is arranged to measure the wavefront aberration of said projection optical system on the basis of light intensity distributions detected with respect to a focus position of the image of the pattern and at least one defocus position of thereof, or of light intensity distributions with respect to different positions.

5. An apparatus according to claim 4, wherein said information processing system measures the wavefront aberration of said projection optical system in accordance with a phase restoration method.

6. An apparatus according to claim 4, wherein said first and second illumination systems include a common element.

7. An apparatus according to claim 1, wherein said first and second illumination systems include a common element.

8. An apparatus according to claim 7, wherein interchanging the first and second illumination conditions with each other is performed by changing a light source to said common element.

9. An apparatus according to claim 1, wherein said first second illumination systems use different optical systems.

10. An apparatus according to claim 9, wherein said first and second illumination systems use different light sources.

11. An apparatus according to claim 1, wherein said light intensity detector measures a light intensity distribution in accordance with a knife edge method.

12. An apparatus according to claim 1, further comprising an enlarging optical system for enlarging the image of the pattern of which light intensity is detected by said light intensity detector.

13. An apparatus according to claim 1, further comprising an adjusting mechanism for adjusting an aberration of said projection optical system on the basis of wavefront aberration information detected by said information processing system.

14. An apparatus according to claim 1, further comprising means for adjusting an aberration of said projection optical system, prior to projection of the transfer pattern onto the second object through said projection optical system, on the basis of wavefront aberration information detected by said information processing system and information related to the transfer pattern.

15. An apparatus according to claim 1, wherein said second illumination system is usable for alignment between the first and second objects.

16. A device manufacturing method, comprising the steps of:
transferring a pattern of a reticle onto a wafer with use of a projection exposure apparatus according to claim 1; and
developing the exposed wafer.

17. A projection exposure apparatus, comprising:
a projection optical system for projecting a pattern of a first object onto a second object;
a first illumination system for illuminating a transfer pattern of the first object under a first illumination condition, wherein the transfer pattern of the first object illuminated under the first illumination condition is projected onto the second object through said projection optical system;
a second illumination system for performing illumination under a second illumination condition;
a light intensity detector, wherein an image of a pattern of the first object, as the same is illuminated under the second illumination by said second illumination system, is formed through said projection optical system, and wherein said light intensity detector detects a light intensity distribution of the image of the pattern; and
an information processing system for measuring a wavefront aberration of said projection optical system on the basis of the detection by said light intensity detector,
wherein the first illumination condition is illumination of spatially partial coherency or incoherency, and the second illumination condition is illumination of spatially coherency or approximate coherency, and
wherein, in each of said first and second illumination systems, a ratio of a numerical aperture of said first or second illumination system to a numerical aperture of said projection optical system is σ, and wherein the first illumination condition satisfies a relation of $0.2 < \sigma \leq 1.0$ while the second illumination condition satisfies a relation of $\sigma \leq 0.2$.

18. A projection exposure apparatus, comprising:
a projection optical system for projecting a pattern of a first object onto a second object;
a first illumination system for illuminating a transfer pattern of the first object under a first illumination condition, wherein the transfer pattern of the first object illuminated under the first illumination condition is projected onto the second object through said projection optical system;
a second illumination system for performing illumination under a second illumination condition;
a light intensity detector, wherein an image of a pattern of the first object, as the same illuminated under the second illumination by said second illumination system, is formed through said projection optical system, and wherein said light intensity detector detects a light intensity distribution of the image of the pattern; and
an information processing system for measuring a wavefront aberration of said projection optical system on the basis of the detection system on the basis of the detection by said light intensity detector,
wherein said first and second illumination systems include a common component, and wherein the first and second illumination conditions are defined exchangeably by adding another component to said common component or by removing the other component.

19. A device manufacturing method, comprising the steps of:
performing a projection exposure process for exposing a wafer to a pattern of a reticle, by use of a projection exposure apparatus which includes (i) a projection optical system for projecting a pattern of a first object onto a second object, (ii) a first illumination system for illuminating a transfer pattern of the first object under a first illumination condition, wherein the transfer pattern of the first object illuminated under the first illumination condition is projected onto the second object through said projection optical system, (iii) a second illumination system for performing illumination under a second illumination condition, (iv) a light intensity detector, wherein an image of a pattern of the first object, as the same is illuminated by said second illumination system and under the second illumination condition, is formed through said projection optical system, and wherein said light intensity detector detects a light intensity distribution of the image of the pattern, and (v) an information processing system for measuring a wavefront aberration of said projection optical system on the basis of the detection by said light intensity detector, wherein said first and second illumination systems include a common component, and wherein the first and second illumination conditions are defined exchangeably by adding another component to said common component or by removing the other component; and developing the exposed wafer.

20. A method according to claim 19, further comprising an adjusting step for adjusting an aberration of the projection optical system on the basis of the detected wavefront aberration.

21. A projection exposure apparatus, comprising:

an illumination optical system for providing illumination under a first illumination condition and illumination under a second illumination condition, wherein the first illumination condition includes a first spatial coherency and a second illumination condition includes a second spatial coherency being different from the first spatial coherency;

a projection optical system for projecting a transfer pattern, as illuminated under the first illumination condition, onto a second object;

a light intensity detector for detecting a light intensity distribution of an image of a measurement pattern illuminated under the second illumination condition, the image of the measurement pattern being formed through said projection optical system; and an information processing system operable to measure spherical aberration and/or astigmatism of said projection optical system on the basis of a detection by said light intensity detector.

22. A device manufacturing method, comprising the steps of:

transferring, by projection exposure, a pattern of a reticle onto a wafer with use of a projection exposure apparatus according to claim 21; and developing the exposed wafer.

23. An apparatus according to claim 21, wherein said light intensity detector is arranged to detect light intensity distributions at different positions, being different from each other, and wherein said information processing system is arranged to measure spherical aberration and/or astigmatism of said projection optical system on the basis of the light intensity distributions measured at the different positions.

24. An apparatus according to claim 23, wherein one of the different positions substantially corresponds to the focus position of the image.

25. An apparatus according to claim 21, wherein the transfer pattern and the measurement pattern differ from each other.

26. A projection exposure apparatus comprising:

an illumination optical system for providing illumination under a first illumination condition and illumination under a second illumination condition, wherein the first illumination condition includes a first spatial coherency and the second illumination condition includes a second spatial coherency being different from the first spatial coherency;

a projection optical system for projecting a transfer pattern, as illuminated under the first illumination condition, onto a second object;

a light intensity detector for detecting a light intensity distribution of an image of a measurement pattern illuminated under the second illumination condition, the image of the measurement pattern being formed through said projection optical system; and an information processing system operable to measure spherical aberration and/or astigmatism of said projection optical system on the basis of a detection by said light intensity detector, wherein the spatial coherency of the second illumination condition is higher than that of the first illumination condition.

27. An apparatus according to claim 26, further comprising a first light source to be used in the first illumination condition and a second light source to be used in the second illumination condition, wherein the first and second light sources differ from each other.

28. An exposure apparatus, comprising:

an illumination optical system for providing illumination under a first illumination condition and illumination under a second illumination condition, wherein the first illumination condition includes a first spatial coherency and the second illumination condition includes a second spatial coherency being different from the first spatial coherency;

a projection optical system for projecting a transfer pattern, as illuminated under the first illumination condition, onto a second object;

a light intensity detector for detecting light intensity distributions at different detection positions, along an optical axis of said projection optical system with respect to an image of a measurement pattern as illuminated under the second illumination condition; and an information processing system for measuring spherical aberration and/or astigmatism of said projection optical system on the basis of a result of detection of the light intensity distributions at the different detection positions made through said light intensity detector.

29. An apparatus according to claim 28, further comprising a coherency-transforming optical system which is arranged to be inserted into and demounted from said illumination optical system as the first and second illumination conditions are to be switched from one to the other.

30. An apparatus according to claim 28, further comprising a first light source to be used in the first illumination condition and a second light source to be used in the second illumination condition, wherein the first and second light sources differ from each other.

31. An apparatus according to claim 28, wherein one of the different detection positions substantially corresponds to the focus position of the image.

32. An apparatus according to claim 28, wherein the transfer pattern and the measurement pattern differ from each other.

33. A device manufacturing method, comprising:

a projection exposure step for transferring, by projection exposure, a pattern of a reticle onto a wafer by use of an exposure apparatus as recited in claim 28; and a development step for developing the wafer processed by said projection exposure step.

34. An exposure apparatus comprising:

an illumination optical system for providing illumination under a first illumination condition and illumination under a second illumination condition, wherein the first illumination condition includes a first spatial coherency and the second illumination condition includes a second spatial coherency being different from the first spatial coherency;

a projection optical system for projecting a transfer pattern, as illuminated under the first illuminating condition, onto a second object;

a light intensity detector for detecting light intensity distributions at different detection positions, along an optical axis of said projection optical system with respect to an image of a measurement pattern as illuminated under the second illumination condition; and an information processing system for measuring spherical aberration and/or astigmatism of said projection optical system on the basis of a result of detection of the light intensity distributions at the different detection positions made through said light intensity detector, wherein the second spatial coherency under the second illumination condition is higher than the first spatial coherency under the first illumination condition.

35. An apparatus according to claim 34, further comprising an adjusting unit for adjusting a size of an effective light source of said illumination optical system, as the first and second illumination conditions are to be switched from one to the other.

36. An apparatus according to claim 34, wherein said illumination optical system including a stop member, and said stop member is adjusted as the fist and second illumination conditions are to be switched from one to the other.

37. An apparatus according to claim 36, wherein an aperture defined under the first illumination condition is larger than an aperture defined under the second illumination condition.

38. An exposure apparatus, comprising:

an illumination optical system for providing illumination under a first illumination condition and illuminating under a second illuminating condition, wherein the first illumination condition includes a first spatial coherency and the second illumination condition includes a second spatial coherency being different from the first spatial coherency;

a projection optical system for projecting a transfer pattern, as illuminated under the first illumination condition, onto a second object;

a light intensity detector for detecting an intensity distribution of light directed by said projection optical system to said light intensity detector, from a measurement pattern being illuminated under the second illumination condition;

an information processing system for measuring spherical aberration and/or astigmatism of said projection optical system on the basis of the detection by said light intensity detector; and an adjusting unit for adjusting a size of an effective light source of said illumination optical system as the first and second illumination conditions are to be switched from one to the other.

39. An apparatus according to claim 38, wherein said light intensity detector is arranged to detect light intensity distributions at different detection positions, along an optical axis of said projection optical system with respect to an image of a measurement pattern as illuminated under the second illumination condition, and wherein said information processing system is arranged to measure the spherical wherein said information processing system is arranged to measure the spherical aberration and/or astigmatism of said projection optical system on the basis of a result of detection of the sight intensity distributions at the different detection positions made through said light intensity detector.

40. A device manufacturing method, comprising:

a projection exposure step for transferring, by projection exposure, a pattern of a reticle onto a wafer by use of an exposure apparatus as recited in claim 38, and a development step for developing the wafer processed by said projection exposure step.

41. An exposure apparatus comprising:

an illumination optical system for providing illumination under a first illumination condition and illumination under a second illumination condition, wherein the first illumination condition includes a first spatial coherency and the second illumination condition includes a second spatial coherency being different from the first spatial coherency;

a projection optical system for projecting a transfer pattern, as illuminated under the first illumination condition, onto a second object;

a light intensity detector for detecting an intensity distribution of light directed by said projection optical system to said light intensity detector, from a measurement pattern being illuminated under the second illumination condition;

an information processing system for measuring a spherical aberration and/or astigmatism of said projection optical system on the basis of the detection by said light intensity detector, wherein the second spatial coherency under the second illumination condition is higher than the first spatial coherency under the first illumination condition.

42. An apparatus according to claim 41, wherein said adjusting unit includes a stop member having an aperture, and the aperture of said stop member is adjusted as the first and second illumination conditions are to be switched from one to the other.

43. An apparatus according to claim 42, wherein the aperture defined under the first illumination condition is larger than the aperture defined under the second illumination condition.

44. An apparatus according to claim 41, further comprising a coherency-transforming optical system which is arranged to be inserted into or demounted from said illumination optical system as the first and second illumination conditions are to be switched from one to the other.

45. An apparatus according to claim 41, further comprising a first light source to be used in the first illumination condition and second light source to be used in the second illumination condition, wherein the first and second light sources differ from each other.

46. An apparatus according to claim 41, wherein one of the different detection positions substantially corresponds to the focus position of the image of the measurement pattern.

47. An apparatus according to claim 41, wherein the transfer pattern and the measurement pattern differ from each other.

48. An exposure apparatus, comprising:

an illumination optical system for providing illumination under a first illumination condition and illumination under a second illumination condition, wherein said first illumination condition includes a first spatial coherency and said second illumination condition includes a second spatial coherency being different from the first spatial coherency;

a projection optical system for projection a transfer pattern, as illuminated under the first illumination condition, onto a second object;

a light intensity detector for detecting an intensity distribution of light directed by said projecting optical system to said light intensity detector, from a measurement pattern being illuminated under the second illumination condition; and an information processing system for measuring spherical aberration and/or astigmatism of said projection optical system on the basis of the detection by said light intensity detector, wherein said illumination optical system includes a coherency-transforming optical system which is arranged to be inserted into or demounted from said illumination optical system as the first and second illumination conditions are to be switched from one to the other.

49. An apparatus according to claim 48, wherein said light intensity detector is arranged to detect light intensity distributions at different detection positions, along an optical axis of said projection optical system with respect to an image of a measurement pattern as illuminated under the second illumination condition, and wherein said information processing system is arranged to measure the spherical aberration and/or astigmatism of said projection optical system on the basis of a result of detection of the light intensity distributions at the different detection positions made through said light intensity detector.

50. An apparatus according to claim 49, wherein one of the different detection positions substantially corresponds to the imaging position of the measurement pattern.

51. An apparatus according to 48, wherein the transfer pattern and the measurement pattern differ from each other.

52. A device manufacturing method, comprising:

a projection exposure step for transferring, by projection exposure, a pattern of a reticle onto a wafer by use of an exposure apparatus as recited in claim 48; and a development step for developing the wafer processed by said projection exposure step.

53. An exposure apparatus comprising:

an illumination optical system for providing illumination under a first illumination condition and illumination under a second illumination condition, wherein said first illumination condition includes a first spatial coherency and said second illumination condition includes a second spatial coherency being different from the first spatial coherency;

a projection optical system for projection a transfer pattern, as illuminated under the first illumination condition, onto a second object;

a light intensity detector for detecting an intensity distribution of light directed by said projection optical system to said light intensity detector, from a measurement pattern being illuminated under the second illumination condition; and an information processing system for measuring spherical aberration and/or astigmatism of said projection optical system on the basis of the detection by said light intensity detector, wherein said illuminating optical system includes a coherency-transforming optical system which is arranged to be inserted into or demounted from said illumination optical system as the first and second illumination conditions are to be switched from one to the other, and wherein the second spatial coherency under the second illumination condition is higher than the first spatial coherency under the first illumination condition.

54. An apparatus according to claim 53, further comprising an adjusting unit for adjusting a size of an effective light source of said illumination optical system as the first and second illumination conditions are to be switched from one to the other.

55. An apparatus according to claim 54, wherein said adjusting unit includes a stop member having an aperture, and wherein the aperture of said stop member is adjusted as the first and second illumination conditions are to be switched from one to the other.

56. An apparatus according to claim 55, wherein the aperture defined under the first illumination condition is larger than the aperture defined under the second illumination condition.

* * * * *

UNITED STATES PATENT AND TRADEMARK OFFICE
CERTIFICATE OF CORRECTION

PATENT NO.    : 6,833,906 B1
DATED         : December 21, 2004
INVENTOR(S)   : Yoshinori Ohsaki It is certified that error appears in the above-identified patent and that said Letters Patent is hereby corrected as shown below:

<u>Title page,</u>
Item [*] Notice, insert the following paragraph:
-- This patent issued on a continued prosecution application filed
   under 37 CFR 1.53(d), and is subject to the twenty year patent
   term provisions of 35 U.S.C. 154(a)(2). --.

<u>Drawings,</u>
Sheet 9 of 12, "FIG. 9," the leftmost reference numeral "29" should read -- 29b -- and the rightmost reference numeral "29" should read -- 29a --.
Sheet 10 of 12, "FIG. 10," the leftmost reference numeral "29" should read -- 29b -- and the rightmost reference numeral "29" should read -- 29a --.

<u>Column 10,</u>
Line 19, "In" should read -- On --.
Line 22, "a twice" should read -- double the --.

<u>Column 12,</u>
Line 65, "tially" should read -- tially partial coherency --.

<u>Column 14,</u>
Line 20, "tially" should read -- tially partial coherency --.
Line 49, "basis of the detection system on the" should be deleted.

<u>Column 17,</u>
Line 34, "including" should read -- includes --.
Line 35, "fist" should read -- first --.
Lines 43 and 44, "illuminating" should read -- illumination --.

<u>Column 18,</u>
Line 4, "said information pro-" should be deleted.
Line 5, "cessing system is arranged to measure the spherical wherein" should be deleted.
Line 8, "sight" should read -- light --.
Line 32, "a" should be deleted.

<u>Column 19,</u>
Line 6, "projection" should read -- projecting --.

UNITED STATES PATENT AND TRADEMARK OFFICE
CERTIFICATE OF CORRECTION

PATENT NO.   : 6,833,906 B1
DATED        : December 21, 2004
INVENTOR(S)  : Yoshinori Ohsaki It is certified that error appears in the above-identified patent and that said Letters Patent is hereby corrected as shown below:

<u>Column 20,</u>
Line 9, "projection" should read -- projecting --.

Signed and Sealed this

Fourteenth Day of February, 2006

JON W. DUDAS
*Director of the United States Patent and Trademark Office*